United States Patent
Sip

(10) Patent No.: US 9,001,526 B2
(45) Date of Patent: *Apr. 7, 2015

(54) ELECTRONIC DEVICE

(71) Applicant: Acer Incorporated, New Taipei (TW)

(72) Inventor: Kim Yeung Sip, New Taipei (TW)

(73) Assignee: Acer Incorporated, New Taipei (TW)

(*) Notice: Subject to any disclaimer, the term of this patent is extended or adjusted under 35 U.S.C. 154(b) by 165 days.

This patent is subject to a terminal disclaimer.

(21) Appl. No.: 13/736,970

(22) Filed: Jan. 9, 2013

(65) Prior Publication Data
US 2014/0071648 A1 Mar. 13, 2014

(30) Foreign Application Priority Data
Sep. 7, 2012 (TW) .............................. 101132862 A

(51) Int. Cl.
H05K 7/02 (2006.01)
H05K 5/02 (2006.01)
G06F 1/16 (2006.01)

(52) U.S. Cl.
CPC ............ *H05K 5/0226* (2013.01); *G06F 1/1615* (2013.01); *G06F 1/1681* (2013.01)

(58) Field of Classification Search
USPC ............... 361/679.15, 679.28, 728–730, 755, 361/807, 809, 810; 464/51, 61.1, 66.1, 464/68.41; 192/70.16, 207, 212, 214.1
See application file for complete search history.

(56) References Cited

U.S. PATENT DOCUMENTS

| | | | |
|---|---|---|---|
| 6,925,684 B2* | 8/2005 | Kang et al. ....................... 16/264 |
| 7,257,431 B2* | 8/2007 | Chen et al. .................. 455/575.3 |
| 8,248,764 B2* | 8/2012 | Hassemer et al. ........ 361/679.01 |
| 8,369,104 B2* | 2/2013 | Kim et al. ...................... 361/814 |
| 8,780,570 B2* | 7/2014 | Bohn et al. .................... 361/755 |
| 2014/0070686 A1* | 3/2014 | Sip ................................. 312/327 |

* cited by examiner

Primary Examiner — Hung S Bui
(74) Attorney, Agent, or Firm — Jianq Chyun IP Office

(57) ABSTRACT

An electronic device includes a first body, a second body and a hinge structure. The hinge structure includes a first pivot component, a second pivot component, a first connecting component and a torsion adjusting assembly. The first pivot component is fixed on the first body. The second pivot component is fixed on the second body and pivoted to the first pivot component. The first connecting component is fixed on the first pivot component. The torsion adjusting assembly is movably disposed at the second body. When the torsion adjusting assembly is moved to a first position, the first connecting component and the torsion adjusting assembly are separated and the hinge structure has a first torsion. When the torsion adjusting assembly is moved to a second position, the first connecting component is connected to the torsion adjusting assembly and the hinge structure has a second torsion larger than the first torsion.

10 Claims, 4 Drawing Sheets

ELECTRONIC DEVICE

CROSS-REFERENCE TO RELATED APPLICATION

This application claims the priority benefit of Taiwan application serial no. 101132862, filed on Sep. 7, 2012. The entirety of the above-mentioned patent application is hereby incorporated by reference herein and made a part of this specification.

BACKGROUND

1. Field of the Invention

The invention is directed to an electronic device and more particularly to an electronic device having a hinge structure.

2. Description of Related Art

Benefiting from the advances in semiconductor devices and display technology, electronic apparatuses are unceasingly trending toward increasingly smaller sizes, a plurality of functions and convenient portability. Common portable electronic apparatuses include tablet PCs, smart phones, notebook computers and so forth. Taking the notebook computers for example, a general type notebook computer is composed of a host and a display. The host and the display are pivoted to each other by a hinge structure. In the notebook computer, a user may close the display to the host by the relative rotation of the host and the display for convenient portability. When desiring to use the notebook computer, the user opens the display for convenient operation.

More and more notebook computers are equipped with a touch control display. If torsion of the hinge structure between the display and the host is overly large, the user may not smoothly open the display from the host and even may have to open the display by pressing the host. On the other hand, if the torsion of the hinge structure between the display and the host is overly small, the force of pressing the display usually causes the display to shake when the user operates the display by a touch control manner, which causes the user visual discomfort and operational difficulty.

SUMMARY

The invention is directed to an electronic device having a hinge structure and torsion of the hinge structure is adjustable as demanded.

The invention is directed to an electronic device, including a first body, a second body and a hinge structure. The hinge structure includes a first pivot component, a second pivot component, a first connecting component and a torsion adjusting assembly. The first pivot component is fixed on the first body. The second pivot component is fixed on the second body and pivoted to the first pivot component. The first connecting component is fixed on the first pivot component. The torsion adjusting assembly is movably disposed at the second body. When the torsion adjusting assembly is moved to a first position, the first connecting component and the torsion adjusting assembly are separated from each other and the hinge structure has a first torsion. When the torsion adjusting assembly is moved to a second position, the first connecting component is connected to the torsion adjusting assembly and the hinge structure has a second torsion. The second torsion is larger than the first torsion.

In an embodiment of the invention, the first torsion is between the first pivot component and the second pivot component.

In an embodiment of the invention, the torsion adjusting assembly includes a moving component and a second connecting component. The moving component is movably disposed at the second body. The second connecting component is pivoted to the moving component. The second torsion is between the moving component and the second connecting component. When the moving component is moved to the first position, the first connecting component and the second connecting component are separated from each other. When the moving component is moved to the second position, the first connecting component is connected to the second connecting component.

In an embodiment of the invention, the electronic device further comprises at least one cylinder. The cylinder is fixed on the second body. The moving component has at least one opening and is slidably disposed at the cylinder through the opening.

In an embodiment of the invention, the cylinder has a position-limiting part. An outer diameter of the position-limiting part is larger than an aperture of the opening so as to limit a moving range of the moving component.

In an embodiment of the invention, the first connecting component and the second connecting component are gears. When the second connecting component is moved to the second position, the first connecting component is engaged with the second connecting component.

In an embodiment of the invention, the electronic device further comprises an actuating unit. The actuating unit includes a coil and a magnetic component. The coil is fixed on the second body. The magnetic component is fixed on the torsion adjusting assembly. The coil is adapted to be energized to generate a magnetic field so that the magnetic component is moved to the first position or the second position.

In an embodiment of the invention, the first connecting component has a through hole, and the second pivot component passes through the through hole to be pivoted to the first pivot component.

In an embodiment of the invention, when an included angle between the first body and the second body is larger than a first angle and smaller than a second angle, the torsion adjusting assembly is moved to the second position. When the included angle between the first body and the second body is smaller than the first angle or larger than the second angle, the torsion adjusting assembly is moved to the first position.

In an embodiment of the invention, the first body has a touch display panel.

To sum up, the electronic device of the invention has the torsion adjusting assembly. The torsion adjusting assembly may be moved to the first position so that the first connecting component is separated from the torsion adjusting assembly or moved to the second position so that the first connecting component is connected to the torsion adjusting assembly. When the connecting component and the torsion adjusting assembly are separated from each other, the hinge structure has the smaller first torsion so that the user may smoothly open or close the first body relative to the second body. When the first connecting component is connected to the torsion adjusting assembly, the hinge structure has the larger second torsion so as to avoid the first body being shaken due to the touch control operation of the user, and thus, the operation and control of the electronic device may be improved.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
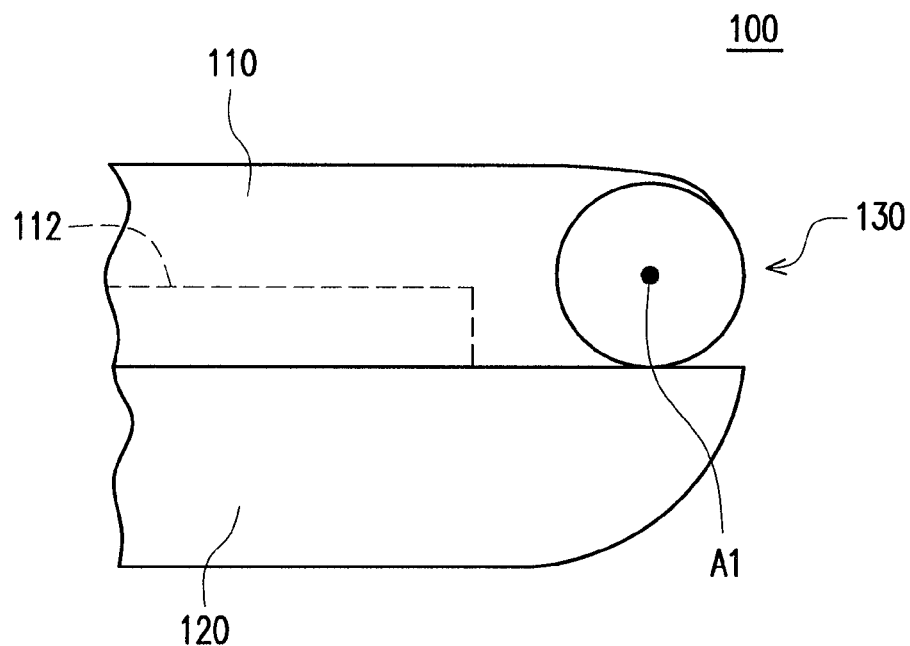
FIG. 1 is a schematic diagram partially illustrating an electronic device according to an embodiment of the invention.
Figure 2A:
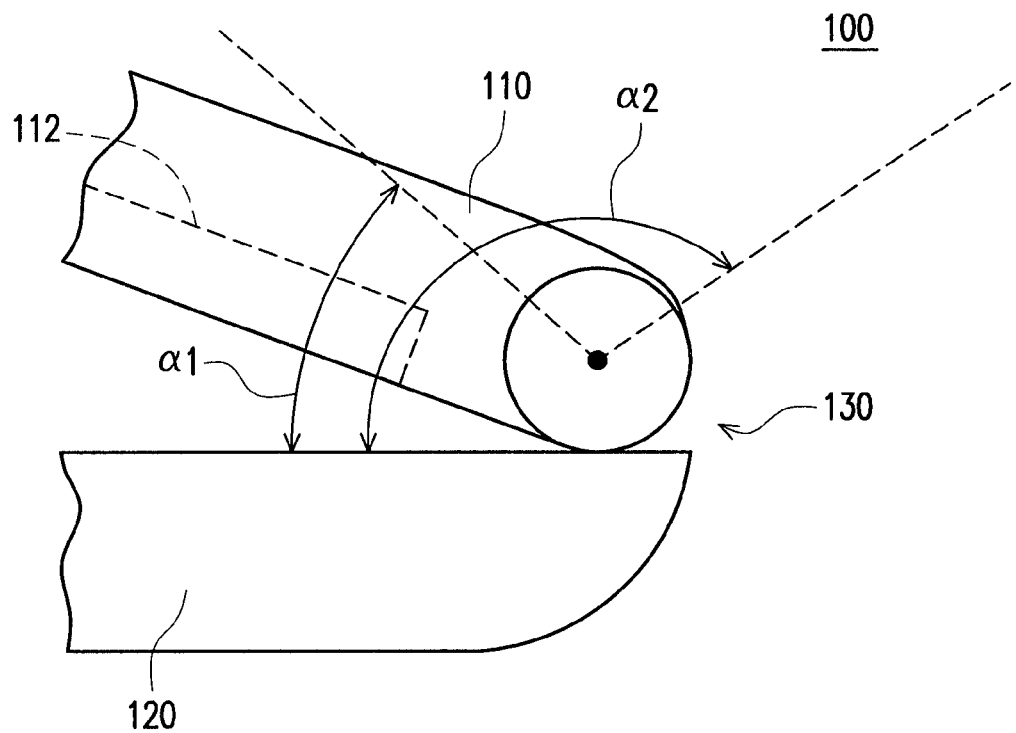
FIG. 2A through FIG. 2C are schematic diagrams illustrating that a first body and a second body depicted in FIG. 1 rotate relative to each other.
Figure 2B:
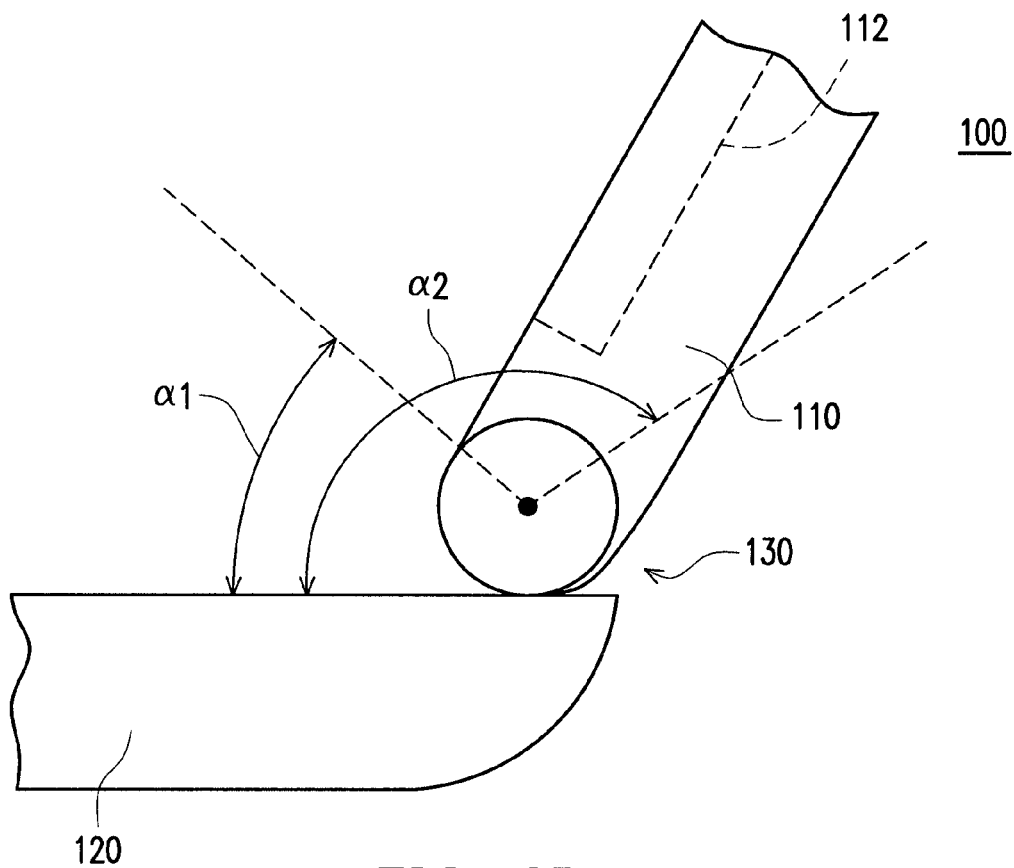
Figure 2C:
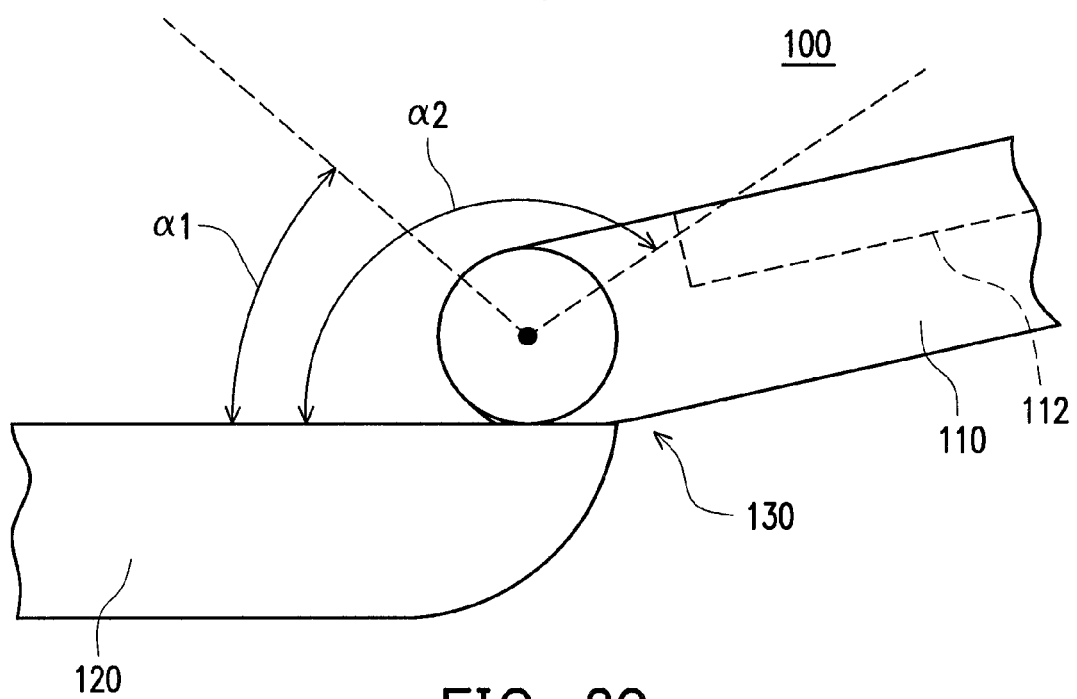
Figure 3:
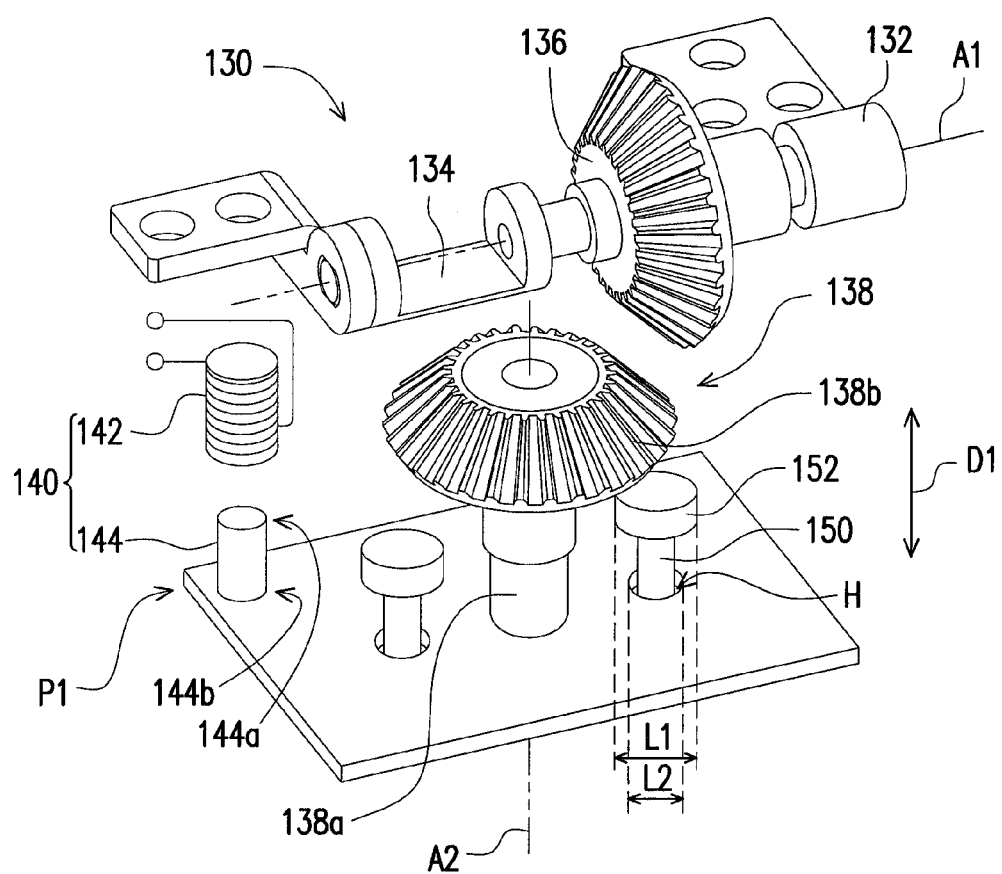
FIG. 3 is a schematic diagram illustrating a hinge structure depicted in FIG. 1.

FIG. 1 is a schematic diagram partially illustrating an electronic device according to an embodiment of the invention. FIG. 2A through FIG. 2C are schematic diagrams illustrating that a first body and a second body depicted in FIG. 1 rotate relative to each other. FIG. 3 is a schematic diagram illustrating the hinge structure depicted in FIG. 1. Referring to FIG. 1 and FIG. 3, an electronic device 100 of the present embodiment includes a first body 110, a second body 120 and a hinge structure 130. The hinge structure 130 includes a first pivot component 132, a second pivot component 134, a first connecting component 136 and a torsion adjusting assembly 138. The first pivot component 132 is fixed on the first body 110. The second pivot component 134 is fixed on the second body 120 and pivoted to the first pivot component 132 along an axis line A1, such that the first body 110 can be closed relative to the second body 120 as shown in FIG. 1 or opened relative to the second body 120 as shown in FIG. 2A through FIG. 2C through the first pivot component 132 and the second pivot component 134.

The electronic device 100 of the present embodiment is a notebook computer, and the first body 110 and the second body 120 are respectively a display and a host of the notebook computer, for example. The first body 110, for example, has a touch display panel 112 for a user to perform a touch control operation. In other embodiments, the electronic device 100 may be any other adaptive type of device and the invention is not limited thereto.

Figure 4:
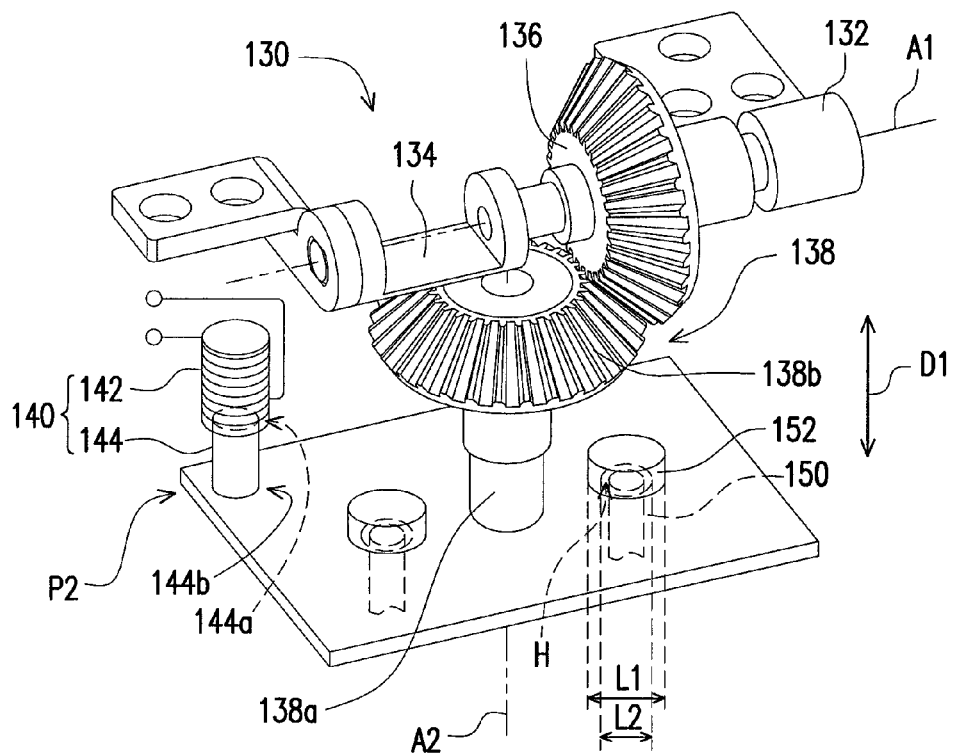
FIG. 4 is a schematic diagram illustrating that the torsion adjusting assembly depicted in FIG. 3 is connected to the first connecting component.

FIG. 4 is a schematic diagram illustrating that the torsion adjusting assembly depicted in FIG. 3 is connected to the first connecting component. Referring to FIG. 3 and FIG. 4, the first connecting component 136 is fixed on the first pivot component 132, and the torsion adjusting assembly 138 is movably disposed at the second body 120. When the torsion adjusting assembly 138 is moved to a first position P1 as shown in FIG. 3, the first connecting component 136 and the torsion adjusting assembly 138 are separated from each other so that the hinge structure 130 has a first torsion. When the torsion adjusting assembly 138 is moved to a second position P2 as shown in FIG. 4, the first connecting component 136 is connected to the torsion adjusting assembly 138 so that the hinge structure 130 has a second torsion. The second torsion is larger than the first torsion.

In the aforementioned configuration, when the first connecting component 136 and the torsion adjusting assembly 138 are separated from each other so that the hinge structure 130 has the smaller first torsion, the user may smoothly open or close the first body 110 relative to the second body 120. When the first connecting component 136 is connected to the torsion adjusting assembly 138 so that the hinge structure 130 has the larger second torsion to avoid the first body 110 being shaken due to the touch control operation of the user, and thus, the operation and control of the electronic device 100 may be improved. Moreover, an operation timing of the torsion adjusting assembly 138 may be preset by using software, of which an example will be illustrated hereinafter.

The operation timing of the torsion adjusting assembly 138 may be set as follows. When an included angle between the first body 110 and the second body 120 is larger than a first angle α1 and smaller than a second angle α2 as show in FIG. 2B, it is suitable for the user, at this time, to perform the touch control operation on the touch display panel 112 of the first body 110. The electronic device 100 automatically moves the torsion adjusting assembly 138 to the second position P2 depicted in FIG. 4 so that the hinge structure 130 has the larger second torsion to avoid the first body 110 being shaken due to the touch control operation. When the included angle between the first body 110 and the second body 120 is smaller than the first angle α1 (as shown in FIG. 2A) or larger than the second angle α2 (as shown in FIG. 2C), the electronic device 100 automatically moves the torsion adjusting assembly 139 to the first position P1 depicted in FIG. 3 so that the hinge structure 130 has the smaller first torsion and the user may drive the first body 110 to rotate relative to second body 120 with less effort. In the present embodiment, the first angle α1 is, for example, 45 degrees and the second angle α2 is 135 degrees, but the invention is not limited thereto. The first angle α1 and the second angle α2 may be any other adaptive angles, respectively. When presetting the operation timing of the torsion adjusting assembly 138 in the manner as described above, a torsion of the hinge structure 130 of the electronic device 100 may be automatically adjusted according to the included angle between the first body 110 and the second body 120 so as to improve convenience of operating the electronic device 100. In other embodiments, any other adaptive setting may be performed on the operation timing of the torsion adjusting assembly 138 and the invention is not limited thereto.

In detail, the torsion adjusting assembly 138 of the present embodiment includes a moving component 138a and a second connecting component 138b. The moving component 138a is movably disposed at the second body 120, and the second connecting component 138b is pivoted to the moving component 138a along an axis line A2. The axis line A2 is, for example, perpendicular to the axis line A1. However, in other embodiments, the axis line A2 may not be perpendicular to the axis line A1, and the invention is not limited thereto. When the moving component 138a is moved to the first position P1 as shown in FIG. 3, the first connecting component 136 is separated from the second connecting component 138b. When the moving component 138a is moved to the second position P2 as shown in FIG. 4, the first connecting component 136 is connected to the second connecting component 138b.

In the present embodiment, both the first connecting component 136 and the second connecting component 138b are, for example, gears (which are illustrated as bevel gears), and the first torsion is between the first pivot component 132 and the second pivot component 134, while the second torsion is between the moving component 138a and the second connecting component 138b. When the torsion adjusting assembly 138 and the second connecting component 138b of the first connecting component 136 are separated from each other as shown in FIG. 3, the user has to apply a force against the first torsion between the first pivot component 132 and the second pivot component 134 so that the first body 110 is opened or closed relative to the second body 120 as shown in FIG. 1 and FIG. 2A through FIG. 2C. When the moving component 138a is moved to the second position P2 as shown in FIG. 4 to drive the first connecting component 136 and the second connecting component 138b of the torsion adjusting assembly 138 to engage with each other, the user has to apply a greater force against the second torsion between the moving component 138a and the second connecting component 138b, such that the first body 110 is driven to operate.

In the present embodiment, the second torsion between the moving component 138a and the second connecting component 138b is designed as larger than the torsion generated when the user performs the touch control operation on the first body 110, for example. Thus, when the first connecting component 136 and the torsion adjusting assembly 138 are connected with each other as shown in FIG. 4, the situation that the first body 110 is shaken when performing the touch control operation thereon may be mitigated or avoided.

Referring to FIG. 3 and FIG. 4, the electronic device 100 (which is labeled in FIG. 1) of the present embodiment further includes at least one cylinder 150 (illustrated as two). The cylinder 150 is fixed on the second body 120. The moving component 138a has at least one opening H (illustrated as two) and is slidably disposed at the cylinder 150 through the opening H so that the moving component 138a is adapted to move relative to the second body 120 along a direction D1. In the present embodiment, the cylinder 150 has a position-limiting part 152. The position-limiting part 152 has an outer diameter L1 larger than an aperture of the opening H so as to limit a moving range of the moving component 138a.

The electronic device 100 of the present embodiment further includes an actuating unit 140. The actuating unit 140 includes a coil 142 and a magnetic component 144. The coil 142 is fixed on the second body 120. The magnetic component 144 is, for example, a magnet and fixed on the torsion adjusting assembly 138. The coil 142 is adapted to be energized to generate a magnetic field so as to drive the magnetic component 144 to move to the first position P1 or the second position P2. For instance, an end 144a of the magnetic component 144 is for example, the S pole and the other end 144b of the magnetic component 144 is for example, the N pole. When the user wishes the hinge structure 130 to have the larger second torsion, the coil 142 is energized to generate a magnetic field. The magnetic field enables the end 144a (the S pole) of the magnetic component 144 to move toward the coil 142 and reach the second position P2 as shown in FIG. 4 so that the second connecting component 138b is engaged with the first connecting component 136. Otherwise, when the user whishes the hinge structure 130 to have the smaller first torsion, the coil 142 is energized by a reverse current to generate a magnetic field in reverse to the aforementioned magnetic field. The reverse magnetic field enables the end 144a (the S pole) of the magnetic component 144 to depart away from the coil 142 and reach the first position P1 as shown in FIG. 3 so that the second connecting component 138b and the first connecting component 136 are separated from each other. In other embodiments, any other adaptive type of actuating component may be utilized to drive the torsion adjusting assembly 138, and the invention is not limited thereto.

When the torsion adjusting assembly 138 is moved to the first position P1 depicted in FIG. 3 or the second position P2 depicted in FIG. 4, the torsion adjusting assembly 138 may be locked by an adaptive hook structure of the second body 120 so that the position of the torsion adjusting assembly 138 is fixed without continuously energizing the coil 142 to save the power of the electronic device 100.

Figure 5:
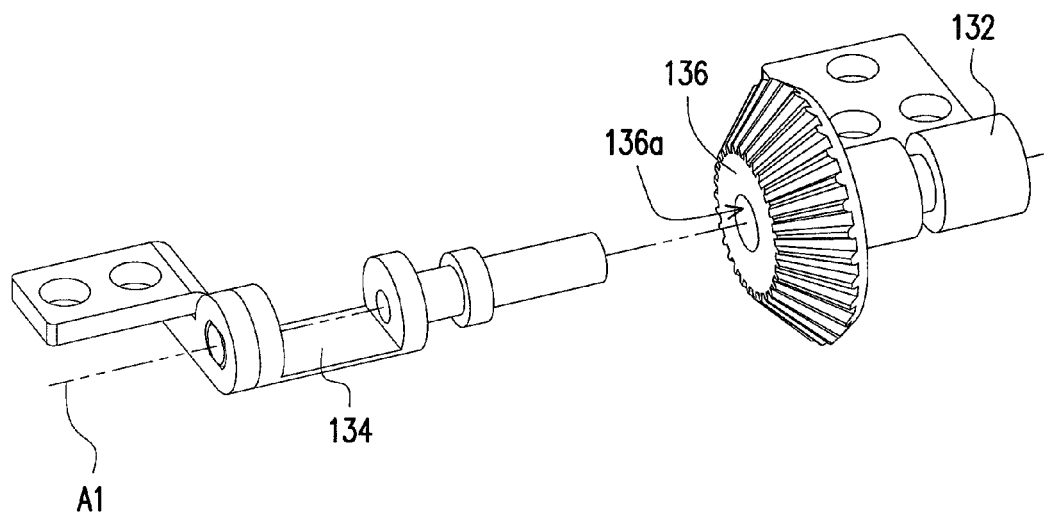
FIG. 5 is an exploded diagram illustrating a portion of the components of the hinge structure depicted in FIG. 3.

FIG. 5 is an exploded diagram illustrating a portion of the components of the hinge structure depicted in FIG. 3. Referring to FIG. 5, in the present embodiment, the first connecting component 136 has a through hole 136a, and the second pivot component 134 passes through the through hole 136a of the first connecting component 136 to be pivoted to the first pivot component 132. In other words, the first connecting component 136 is disposed on the pivotally rotary axis line A1 of the hinge structure 130 to save disposition spaces. In other embodiments, the first connecting component 136 may be fixed on any other adaptive position of the first pivot component 132 and the invention is not limited thereto.

Based on the above, the electronic device of the invention has a torsion adjusting assembly. The torsion adjusting assembly may be moved to the first position to enable the first connecting component to separate from the torsion adjusting assembly or moved to the second position to enable the first connecting component to connect to torsion adjusting assembly. When the first connecting component and the torsion adjusting assembly are separated from each other, the hinge structure has the smaller first torsion so that the user may smoothly open or close the first body relative to the second body. When the first connecting component is connected to the torsion adjusting assembly, the hinge structure has the larger second torsion to avoid the first body being shaken due to the touch control operation of the use. As such, the operation and control of the electronic device may be improved. In addition, the operating timing of the torsion adjusting assembly may be preset so that the torsion of the hinge structure of the electronic device may be automatically adjusted according to the included angle between the first body and the second body so as to improve the convenience of operating the electronic device.

Although the invention has been described with reference to the above embodiments, it will be apparent to one of ordinary skill in the art that modifications to the described embodiment may be made without departing from the spirit of the invention. Accordingly, the scope of the invention will be defined by the attached claims not by the above detailed descriptions.

What is claimed is:

1. An electronic device, comprising:
   a first body;
   a second body; and
   a hinge structure, comprising:
      a first pivot component, fixed on the first body;
      a second pivot component, fixed on the second body and pivoted to the first pivot component;
      a first connecting component, fixed on the first pivot component; and
      a torsion adjusting assembly, movably disposed at the second body, wherein when the torsion adjusting assembly is moved to a first position, the first connecting component and the torsion adjusting assembly are separated from each other and the hinge structure has a first torsion, and when the torsion adjusting assembly is moved to a second position, the first connecting component is connected to the torsion adjusting assembly and the hinge structure has a second torsion, wherein the second torsion is larger than the first torsion.

2. The electronic device according to claim 1, wherein the first torsion is between the first pivot component and the second pivot component.

3. The electronic device according to claim 1, wherein the torsion adjusting assembly comprises:

a moving component, movably disposed at the second body; and a second connecting component, pivoted to the moving component, wherein the second torsion is between the moving component and the second connecting component, when the moving component is moved to the first position, the first connecting component and the second connecting component are separated from each other, and when the moving component is moved to the second position, the first connecting component is connected to the second connecting component.

4. The electronic device according to claim 3, further comprising at least one cylinder, wherein the cylinder is fixed on the second body, the moving component has at least one opening and is slidably disposed on the cylinder through the opening.

5. The electronic device according to claim 4, wherein the cylinder has a position-limiting part having an outer diameter larger than an aperture of the opening so as to limit a moving range of the moving component.

6. The electronic device according to claim 3, wherein the first connecting component and the second connecting component are gears, and when the moving component is moved to the second position, the first connecting component is engaged with the second connecting component.

7. The electronic device according to claim 1, further comprising an actuating unit, wherein the actuating unit comprises:

a coil, fixed on the second body; and a magnetic component, fixed on the torsion adjusting assembly, wherein the coil is adapted to be energized to generate a magnetic field so as to drive the magnetic component to move to the first position or the second position.

8. The electronic device according to claim 1, wherein the first connecting component has a through hole and the second pivot component passes through the through hole to be pivoted to the first pivot component.

9. The electronic device according to claim 1, wherein when an included angle between the first body and the second body is larger than a first angle and smaller than a second angle, the torsion adjusting assembly is moved to the second position, and when the included angle between the first body and the second body is smaller than the first angle or larger than the second angle, the torsion adjusting assembly is moved to the first position.

10. The electronic device according to claim 1, wherein the first body has a touch display panel.

* * * * *